US012131969B2

(12) United States Patent
Sannai et al.

(10) Patent No.: US 12,131,969 B2
(45) Date of Patent: Oct. 29, 2024

(54) SEMICONDUCTOR MODULE

(71) Applicant: Mitsubishi Electric Corporation, Tokyo (JP)

(72) Inventors: Hiroya Sannai, Tokyo (JP); Seiichiro Inokuchi, Tokyo (JP); Yuji Imoto, Tokyo (JP); Arata Iizuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 358 days.

(21) Appl. No.: 17/627,171

(22) PCT Filed: Nov. 27, 2019

(86) PCT No.: PCT/JP2019/046445
§ 371 (c)(1),
(2) Date: Jan. 14, 2022

(87) PCT Pub. No.: WO2021/106114
PCT Pub. Date: Jun. 3, 2021

(65) Prior Publication Data
US 2022/0278004 A1 Sep. 1, 2022

(51) Int. Cl.
*H01L 23/10* (2006.01)
*H01L 23/047* (2006.01)

(52) U.S. Cl.
CPC ............ *H01L 23/10* (2013.01); *H01L 23/047* (2013.01)

(58) Field of Classification Search
CPC .............................. H01L 23/047; H01L 23/10
See application file for complete search history.

(56) References Cited

U.S. PATENT DOCUMENTS 5,606,200 A * 2/1997 Haraguchi .............. H01L 23/24
257/788
2012/0001309 A1 1/2012 Soyano
(Continued)

FOREIGN PATENT DOCUMENTS

JP S55-003617 A 1/1980
JP S61-139048 A 6/1986
(Continued)

OTHER PUBLICATIONS

International Search Report issued in PCT/JP2019/046445; mailed Feb. 18, 2020.
(Continued)

*Primary Examiner* — Peniel M Gumedzoe
(74) *Attorney, Agent, or Firm* — Studebaker & Brackett PC

(57) ABSTRACT

An insulating substrate (2) is provided on a base plate (1). A semiconductor device (6-9) is provided on the insulating substrate (2). A case (10) is arranged to surround the insulating substrate and the semiconductor device and bonded to the base plate (1) with an adhesive (11). A sealant (22) seals the insulating substrate and the semiconductor device in the case (10). A groove (23) is provided on a lower surface of the case (10) opposing an upper surface peripheral portion of the base plate (1). A bottom surface of the groove (23) has a protruding part (24) protruding toward the base plate (1). The protruding part (24) includes a vertex (25) and gradients (26,27) respectively provided on an inner side and on an outer side of the case (10) with the vertex (25) sandwiched therebetween. The adhesive (11) contacts the vertex (25) and is housed in the groove (23).

18 Claims, 16 Drawing Sheets

(56) References Cited

U.S. PATENT DOCUMENTS

2019/0164858 A1\* 5/2019 Koyanagi ............... H01L 25/18
2019/0206757 A1   7/2019 Hayashida et al.
2020/0219782 A1   7/2020 Hitomi

FOREIGN PATENT DOCUMENTS

| JP | S63-100842 U | 6/1988 |
| JP | S64-017455 A | 1/1989 |
| JP | 2000-323593 A | 11/2000 |
| JP | 2012-015349 A | 1/2012 |
| JP | 6399272 B1 | 10/2018 |
| WO | 2018055667 A1 | 3/2018 |

OTHER PUBLICATIONS

An Office Action mailed by the Japanese Patent Office on Jul. 26, 2022, which corresponds to Japanese Application No. 2021-560830 with English translation.

\* cited by examiner

EMBODIMENT 1

COMPARATIVE EXAMPLE

SEMICONDUCTOR MODULE

FIELD

The present disclosure relates to a semiconductor module.

BACKGROUND

In a semiconductor module including a power semiconductor device such as a MOSFET (metal oxide semiconductor field effect transistor), an IGBT (insulated gate bipolar transistor), or a diode, an adhesive has been generally used for bonding a case and a base plate. For a module with a potting resin sealing structure, an interface appears between the adhesive and a sealant inside the case. Depending on respective materials for the adhesive and sealing resin, peeling easily occurs at the interface due to a thermal cycling stress because a bonding strength therebetween is weak. Therefore, a problem is that a thermal cycling tolerance decreases and a reliability is compromised. To solve this, a structure in which the case is provided with a slope to make it difficult for the adhesive to enter the inside of the case has been proposed (see, e.g., PTL 1).

CITATION LIST

Patent Literature

[PTL 1] JP 6399272 B

SUMMARY

Technical Problem

However, in a conventional structure, when the adhesive is positioned inside the case because of variation in an adhesive application position, the adhesive may excessively enter the inside of the case after bonding. Further, when the adhesive is positioned outside the case, the case and the base plate may not be sufficiently bonded to each other.

An object of the present invention, which has been made to solve the above-described problem, is to obtain a semiconductor module capable of improving a thermal cycling tolerance and increasing a tolerance for a variation in adhesive application position.

Solution to Problem

A semiconductor module according to the present disclosure includes: a base plate; an insulating substrate provided on the base plate; a semiconductor device provided on the insulating substrate; a case arranged to surround the insulating substrate and the semiconductor device and bonded to the base plate with an adhesive; and a sealant sealing the insulating substrate and the semiconductor device in the case, wherein a groove is provided on a lower surface of the case opposing an upper surface peripheral portion of the base plate, a bottom surface of the groove has a protruding part protruding toward the base plate, the protruding part includes a vertex and gradients respectively provided on an inner side and on an outer side of the case with the vertex sandwiched therebetween, and the adhesive contacts the vertex and is housed in the groove.

Advantageous Effects of Invention

In the present disclosure, when the case is bonded to the base plate with the adhesive, the adhesive contacts the vertex of the protrusion, and is crushed to expand along the gradients on both sides of the protrusion. As a result, a sufficient adhesion area can be ensured. The case and the base plate can be bonded to each other independently of the thickness of the adhesive. A tolerance for the variation in application position of the adhesive can be further increased. The crushed adhesive escapes into an extra space of the groove. Thus, the adhesive is housed in the groove, not to enter the inside of the case. Accordingly, an interface between the adhesive and the sealant can be eliminated or reduced, and a heat cycle tolerance can be improved.

DESCRIPTION OF EMBODIMENTS

A semiconductor module according to the embodiments of the present disclosure will be described with reference to the drawings. The same components will be denoted by the same symbols, and the repeated description thereof may be omitted.

Embodiment 1

Figure 1:
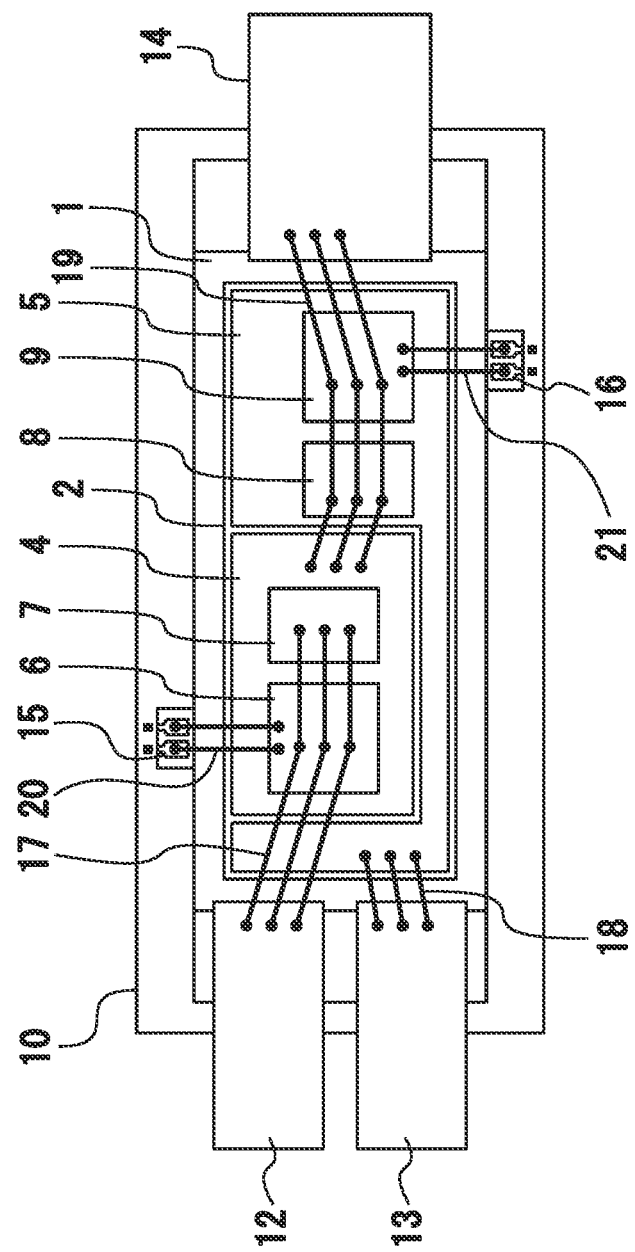
FIG. 1 is a top view illustrating a semiconductor module according to an embodiment 1.
Figure 2:
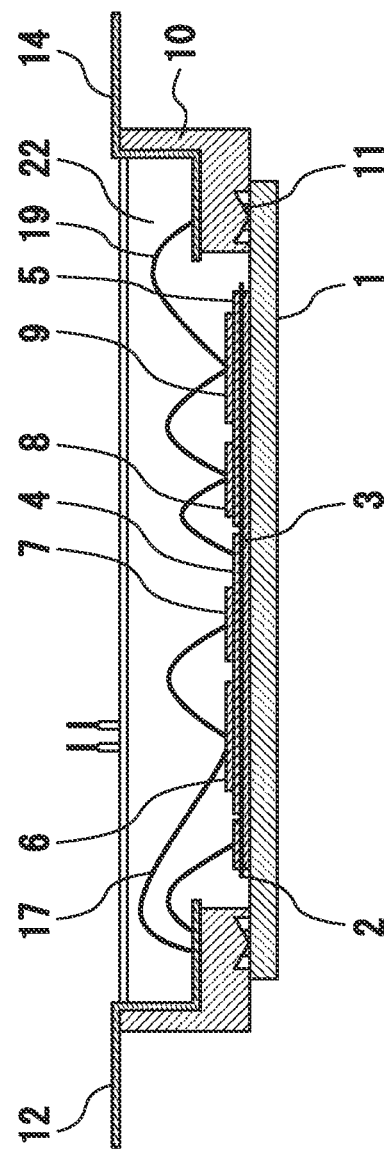
FIG. 2 is a cross-sectional view illustrating the semiconductor module according to the embodiment 1.

FIG. 1 is a top view illustrating a semiconductor module according to an embodiment 1. FIG. 2 is a cross-sectional view illustrating the semiconductor module according to the embodiment 1. A material for a base plate 1 is copper or aluminum. An insulating substrate 2 is provided on the base plate 1. A material for the insulating substrate 2 is a plate composed of ceramics such as silicon nitride, aluminum nitride, aluminum oxide, or Zr-containing alumina. Particularly, silicon nitride or aluminum nitride is preferable in terms of thermal conductivity, and silicon nitride is more preferable in terms of a material strength. Epoxy resin or the like may be used as the insulating substrate 2.

A metal layer 3 is provided on a lower surface of the insulating substrate 2. The metal layer 3 is bonded to the base plate 1 with a solder or the like. Conductive patterns 4 and 5 are provided on the insulating substrate 2. A material for the metal layer 3 and the conductive patterns 4 and 5 is aluminum, an aluminum alloy, copper, or a copper alloy. Particularly, copper is preferable for its excellence in electric conductivity and thermal conductivity.

Semiconductor devices 6 and 7 are provided on the conductive pattern 4. A lower surface electrode of each of the semiconductor device 6 and 7 is bonded to the conductive pattern 4 with a solder or the like. Semiconductor devices 8 and 9 are provided on the conductive pattern 5. A lower surface electrode of each of the semiconductor device 8 and 9 is bonded to the conductive pattern 5 with a solder or the like. Each of the semiconductor devices 6 and 9 is a switching element such as a MOSFET or an IGBT that controls a large current. Each of the semiconductor devices 7 and 8 is a freewheel diode.

A square frame-shaped case 10 is arranged on the base plate 1 to surround the insulating substrate 2 and the semiconductor devices 6 to 9, and is bonded to an upper surface peripheral portion of the base plate 1 with an adhesive 11. It is required for the case 10 to be resistant to thermal deformation in an operating temperature range of the semiconductor module and maintain insulation. Accordingly, a material for the case 10 is resin having a high softening point, such as PPS (poly phenylene sulfide) resin or PBT (poly butylene terephthalate) resin. Examples of a material for the adhesive 11 include silicone resin and epoxy resin. For example, after the adhesive 11 is applied to the upper surface peripheral portion of the base plate 1, and the case 10 is bonded to the base plate 1, the adhesive 11 is thermally cured so that adhesion occurs.

The case 10 is provided with main terminals 12 to 14 and control terminals 15 and 16. A bonding wire 17 connects respective upper electrodes of the semiconductor devices 6 and 7 and the main terminal 12 to each other. A bonding wire 18 connects the conductive pattern 5 and the main terminal 13 to each other. A bonding wire 19 connects the conductive pattern 4, respective upper electrodes of the semiconductor devices 8 and 9, and the main terminal 14 to each other. A bonding wire 20 connects a control electrode of the semiconductor device 6 and the control terminal 15 to each other. A bonding wire 21 connects a control electrode of the semiconductor device 9 and the control terminal 16 to each other.

A sealant 22 seals the insulating substrate 2, the semiconductor devices 6 to 9, and the bonding wires 17 to 21 in the case 10. The base plate 1 and the case 10 tightly seal the sealant 22. The sealant 22 is epoxy resin, phenol resin, polyimide resin, or the like, and an inorganic filler, which is excellent in thermal conductivity, such as alumina or silica is added thereto. Even when respectively materials of the same type, the adhesive 11 and the sealant 22 do not have the same linear expansion coefficient because an additive differs depending on a use application. Accordingly, a thermal stress due to a difference in linear expansion coefficient may be generated depending on a heat cycle.

Figure 3:
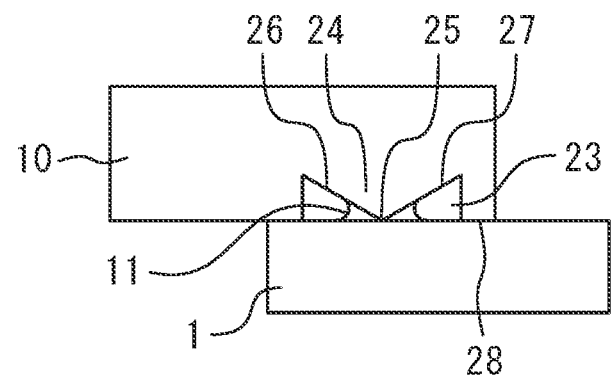
FIG. 3 is a cross-sectional view illustrating a bonding portion between the case and the base plate in the semiconductor module according to the embodiment 1 in an enlarged manner.

FIG. 3 is a cross-sectional view illustrating a bonding portion between the case and the base plate in the semiconductor module according to the embodiment 1 in an enlarged manner. A groove 23 is provided on a lower surface of the case 10 opposing the upper surface peripheral portion of the base plate 1. A bottom surface of the groove 23 has a protruding part 24 protruding toward the base plate 1. The protruding part 24 includes a vertex 25 and gradients 26 and 27 respectively being closer laterally to the outer side of the case 10 and closer laterally to the inner side of the case 10 with the vertex 25 sandwiched therebetween. The adhesive 11 contacts the vertex 25, and is housed in the groove 23. The width of the groove 23 is 2.6 mm or more, for example, and is set depending on application width and variation in position of the adhesive 11. The depth of the groove 23 is 0.4 mm or more, and is set to an estimated value+0.1 mm or more of the height of the adhesive 11. A spacing between the vertex 25 of the protruding part 24 and the base plate 1 is not less than 0 mm nor more than 0.3 mm, for example. When the spacing is the lower-limit value 0 mm, the vertex 25 contacts the base plate 1. The upper-limit value 0.3 mm is less than the estimated value of the height of the adhesive 11. The closer the spacing is to the lower-limit value, the more easily the vertex 25 contacts the adhesive 11.

The lower surface of the case 10 has a plane 28 closer to the inner side of the case 10 than the groove 23. The height of the protruding part 24 is not below a height position of the plane 28, and is not more than a height at which the vertex 25 contacts the base plate 1. Therefore, the plane 28 comes in surface contact with the upper surface peripheral portion of the base plate 1. As a result, even when the adhesive 11 overflows from the groove 23, the adhesive 11 can be prevented from entering the inside of the case 10. The sealant 22 can also be prevented from flowing out to the outside of the case 10.

Figure 4:
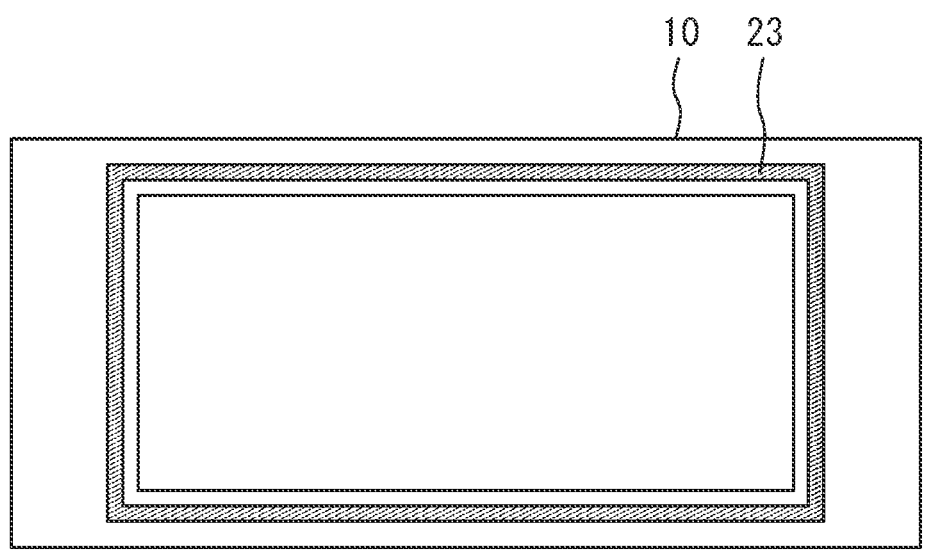
FIG. 4 is a bottom view illustrating the case according to the embodiment 1.

FIG. 4 is a bottom view illustrating the case according to the embodiment 1. The groove 23 is provided on the entire lower surface of the case 10. Although the groove 23 is desirably provided on the entire periphery of a region to which the adhesive 11 is applied, the groove 23 may be provided in only a part of the region if within a range where a reliability can be ensured.

Figure 5:
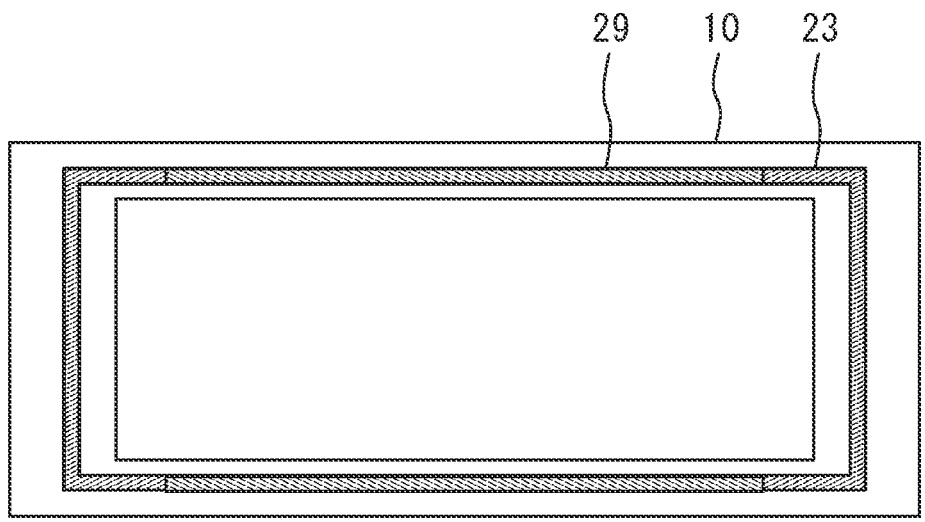
FIG. 5 is a bottom view illustrating a modification 1 of the case according to the embodiment 1.

FIG. 5 is a bottom view illustrating a modification 1 of the case according to the embodiment 1. A groove 23 having a protruding part 24 is provided in a wide portion of a case 10. A groove 29 that lacks a protruding part 24 and has a rectangular cross section is provided in a narrow portion of the case 10. Thus, the groove 23 may be provided in only a place where a groove structure of a sufficient size can be provided.

Figure 6:
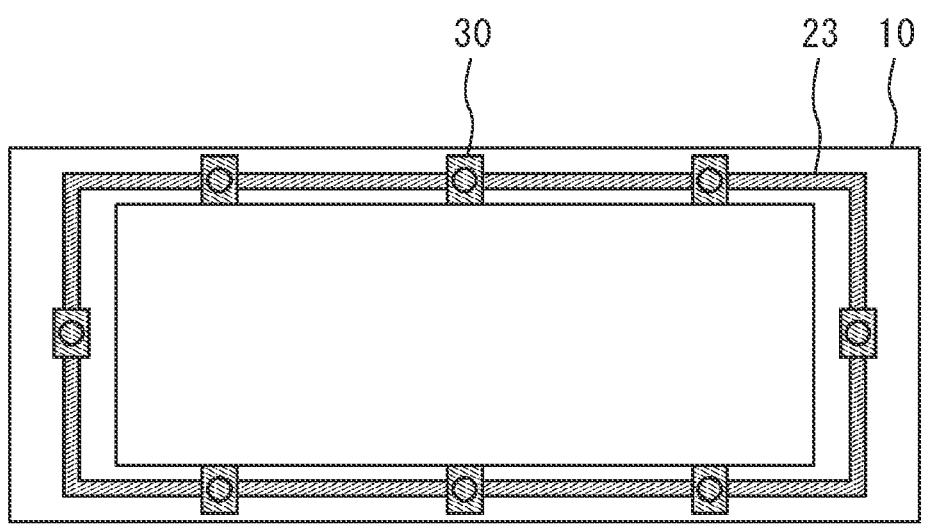
FIG. 6 is a bottom view illustrating a modification 2 of the case according to the embodiment 1.

FIG. 6 is a bottom view illustrating a modification 2 of the case according to the embodiment 1. A case 10 is generally manufactured by injection molding. Accordingly, a gate trace of a resin injection path and an injector pin trace in a case where the case 10 is taken out of a mold remain in the case 10 of a finished product. A groove 23 is provided while avoiding a region 30 where the gate trace or the injector pin trace in the case 10 remains.

Figure 7:
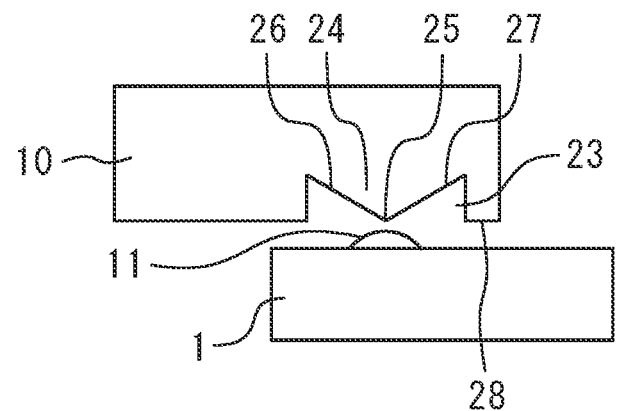
FIG. 7 is a cross-sectional view illustrating a step of bonding the case to the base plate in the semiconductor module according to the embodiment 1.
Figure 8:
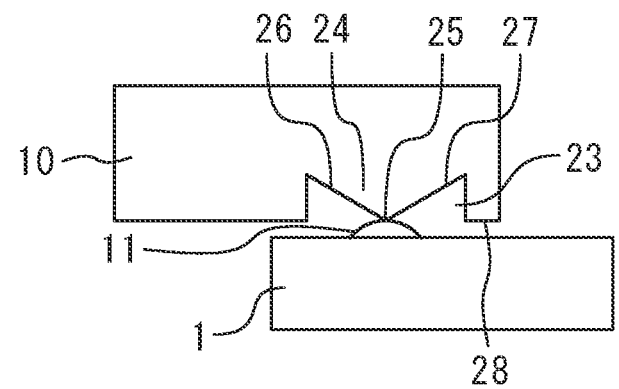
FIG. 8 is a cross-sectional view illustrating a step of bonding the case to the base plate in the semiconductor module according to the embodiment 1.
Figure 9:
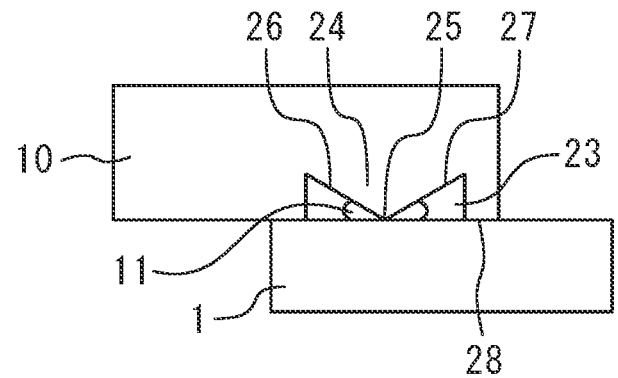
FIG. 9 is a cross-sectional view illustrating a step of bonding the case to the base plate in the semiconductor module according to the embodiment 1.

FIG. 7 to FIG. 9 are cross-sectional views each illustrating a step of bonding the case to the base plate in the semiconductor module according to the embodiment 1. First, the adhesive 11 is applied to the upper surface peripheral portion of the base plate 1, as illustrated in FIG. 7. Then, when an attempt is made to bond the case 10 to the base plate 1, as illustrated in FIG. 8, the adhesive 11 contacts the vertex 25 of the protruding part 24. Then, when the case 10 is further lowered, as illustrated in FIG. 9, the adhesive 11 is crushed, to expand along the gradients 26 and 27 of the protruding part 24. As a result, a sufficient adhesion area can be ensured. The case 10 and the base plate 1 can be bonded to each other independently of the thickness of the adhesive 11.

Figure 10:
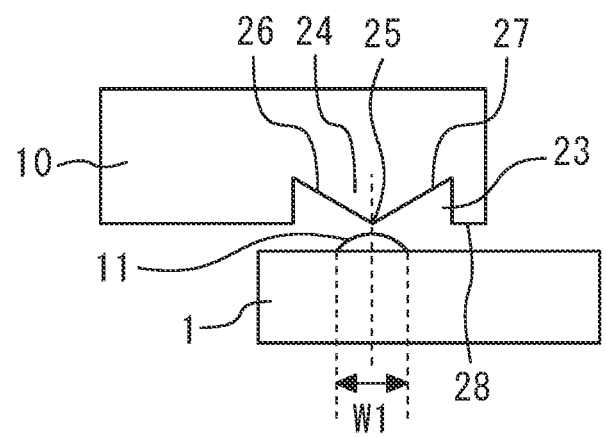
FIG. 10 is a cross-sectional view illustrating a relationship between a groove and an adhesive application position in each of the embodiment 1 and a comparative example.
Figure 10:
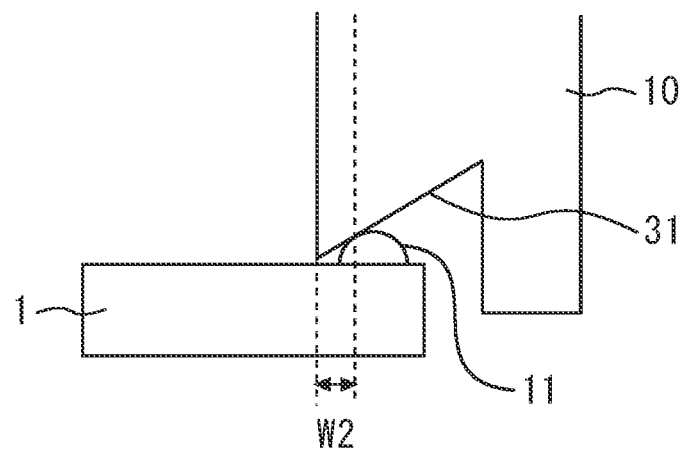

FIG. 10 is a cross-sectional view illustrating a relationship between a groove and an adhesive application position in each of the embodiment 1 and a comparative example. The gradients 26 and 27 are provided on both sides with the vertex 25 of the protruding part 24 sandwiched therebetween in the embodiment 1, while only one gradient 31 is provided in the comparative example. Accordingly, when the adhesive 11 is applied closer to the inner side of the case 10 than the vertex 25 in the comparative example, bonding cannot be achieved. Therefore, a tolerance W2 is smaller than a variation in application position of the adhesive 11.

On the other hand, in the present embodiment, when the case 10 is bonded to the base plate 1 with the adhesive 11, the adhesive 11 contacts the vertex 25 of the protruding part 24, and is crushed to expand along the gradients 26 and 27 on both sides of the protruding part 24. Therefore, even if the adhesive 11 is applied closer to the inner side or closer to the outer side of the case 10 than the vertex 25, bonding can be achieved. Accordingly, a tolerance W1 can be increased for the variation in application position of the adhesive 11. As a result, incorrect assembly can be reduced. The crushed adhesive 11 escapes into an extra space of the groove 23. Thus, the adhesive 11 is housed in the groove 23, not to enter the inside of the case 10. Accordingly, an interface between the adhesive 11 and the sealant 22 can be eliminated or reduced, and a heat cycle tolerance can be improved.

Even when the adhesive 11 does not contact the vertex 25 of the protruding part 24 due to the variation in application position, the gradients 26 and 27 and the base plate 1 can be bonded to each other with the adhesive 11 if there is a slight deviation therebetween. Considering also such a case, a tolerance for the variation in application position of the adhesive 11 can be further increased.

The adhesive 11 does not contact a plane of the case 10 but the vertex 25 of the protruding part 24 and the gradients 26 and 27 in the vicinity thereof. Therefore, an amount of the adhesive 11 that is crushed is small, whereby the adhesive 11 does not overflow from the bonding portion.

For a general rectangular groove, when the height of the adhesive 11 is less than the depth of the groove, the case 10 cannot be bonded to the base plate 1 with the adhesive 11. If an amount of the adhesive 11 is increased to increase the height of the adhesive 11, a risk of overflow of the adhesive 11 increases. On the other hand, in the present embodiment, the vertex 25 of the protruding part 24 provided on the bottom surface of the groove 23 contacts the adhesive 11, whereby bonding can be achieved if the amount of the adhesive 11 is small and the height thereof is low. Therefore, there is a tolerance for a variation in height of the adhesive 11.

A conductive frame may be used instead of the bonding wires 17 to 21. As a result, an allowable current capacity of the semiconductor module increases. Although it is assumed that the semiconductor module is used by connecting the base plate to a cooling fin through grease, a pin fin may be molded in the base plate 1 instead of the cooling fin and the grease. As a result, an assembling process can be omitted, and a thermal resistance is improved.

Embodiment 2

Figure 11:
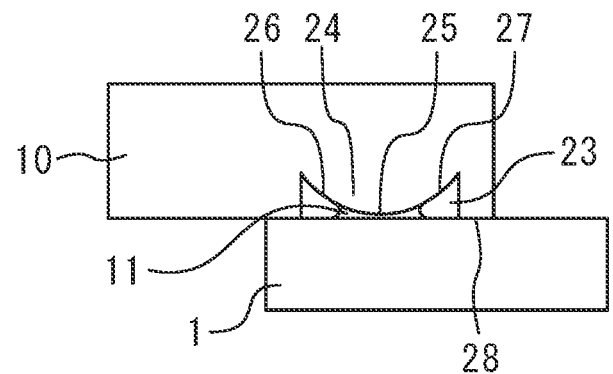
FIG. 11 is a cross-sectional view illustrating a bonding portion between a case and a base plate in a semiconductor module according to an embodiment 2 in an enlarged manner.

FIG. 11 is a cross-sectional view illustrating a bonding portion between a case and a base plate in a semiconductor module according to an embodiment 2 in an enlarged manner. Although the cross section of the protruding part 24 provided on the bottom surface of the groove 23 in the case 10 is triangular in the embodiment 1, a protruding part 24 has a curved shape having a predetermined curvature in the present embodiment. As a result, a risk of a crack and a chip of a case 10 and a case mold is reduced, and durability as a member is improved. Other configurations and effects are similar to those in the embodiment 1.

Embodiment 3

Figure 12:
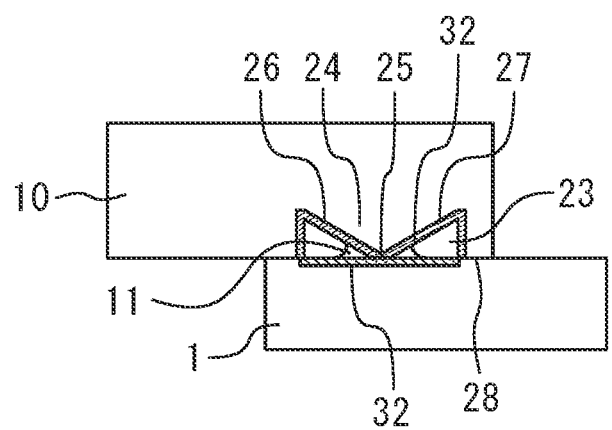
FIG. 12 is a cross-sectional view illustrating a bonding portion between a case and a base plate in a semiconductor module according to an embodiment 3 in an enlarged manner.

FIG. 12 is a cross-sectional view illustrating a bonding portion between a case and a base plate in a semiconductor module according to an embodiment 3 in an enlarged manner. The whole or a part of an inner surface of a groove 23 in a case 10 and the whole or a part of a region, to which an adhesive 11 is applied, of a base plate 1 are subjected to surface roughening processing 32. A fine uneven shape is formed on a surface by the surface roughening processing 32. A difference in height of the uneven shape is 0.01 mm or more, for example. As a result, a flow length of the adhesive 11 increases, and a flow of the adhesive 11 is suppressed. This makes it difficult for the adhesive 11 to further enter the inside of the case 10. Therefore, an interface between the adhesive 11 and a sealant 22 can be eliminated or further reduced. Other configurations and effects are similar to those in the embodiment 1.

Embodiment 4

Figure 13:
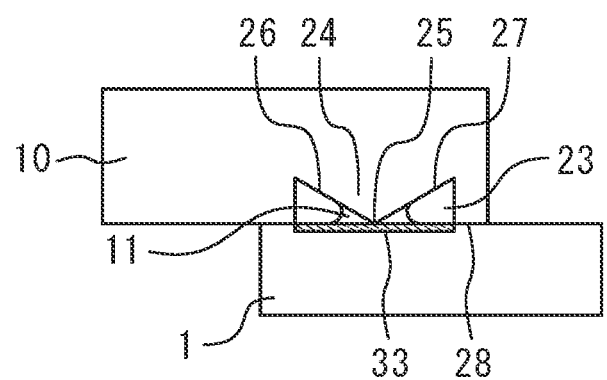
FIG. 13 is a cross-sectional view illustrating a bonding portion between a case and a base plate in a semiconductor module according to an embodiment 4 in an enlarged manner.

FIG. 13 is a cross-sectional view illustrating a bonding portion between a case and a base plate in a semiconductor module according to an embodiment 4 in an enlarged manner. A lattice-shaped sheet 33 is affixed to the whole or a part of a region, to which an adhesive 11 is applied, of a base plate 1. As a result, a similar effect to that in the embodiment 3 can be obtained. Other configurations and effects are similar to those in the embodiment 1.

Embodiment 5

Figure 14:
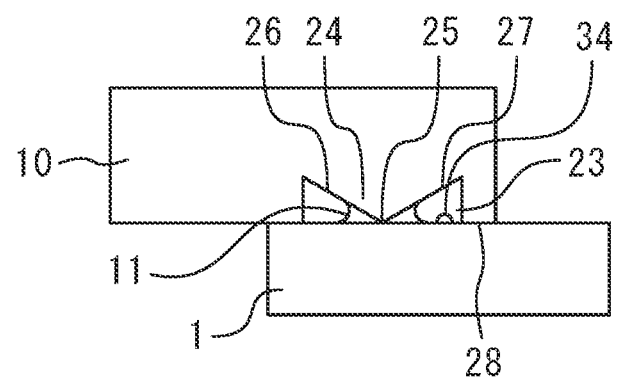
FIG. 14 is a cross-sectional view illustrating a bonding portion between a case and a base plate in a semiconductor module according to an embodiment 5 in an enlarged manner.

FIG. 14 is a cross-sectional view illustrating a bonding portion between a case and a base plate in a semiconductor module according to an embodiment 5 in an enlarged manner. A bonding wire 34 is provided in an upper surface peripheral portion of a base plate 1 opposing a groove 23 and a region closer to the inner side of a case 10 than a region to which an adhesive 11 is applied. As a result, a similar effect to that in the embodiment 3 can be obtained. Other configurations and effects are similar to those in the embodiment 1. The bonding wire 34 may also be provided in a region closer to the outer side of the case 10 than the region to which the adhesive 11 is applied. This makes it possible to prevent the adhesive 11 from overflowing to the outside of the case 10.

Embodiment 6

Figure 15:
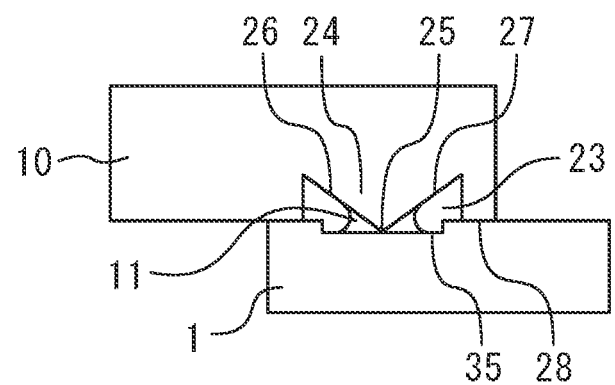
FIG. 15 is a cross-sectional view illustrating a bonding portion between a case and a base plate in a semiconductor module according to an embodiment 6 in an enlarged manner.

FIG. 15 is a cross-sectional view illustrating a bonding portion between a case and a base plate in a semiconductor module according to an embodiment 6 in an enlarged manner. A base plate 1 is provided with a recess 35 to oppose a groove 23 in a case 10. An adhesive 11 is applied to a bottom surface of the recess 35. The width of the recess 35 is larger than the width of a region to which the adhesive 11 is applied, and is smaller than the width of the groove 23. The height of a protruding part 24 is set to a height at which a vertex 25 contacts the adhesive 11 in the recess 35. Although the depth of the recess 35 is 0.1 mm or more, for example, the depth is set to four-fifths or less of the thickness of the base plate 1 to prevent penetration of the base plate 1.

When the recess 35 is provided, a housing space of the adhesive 11 is widened. This makes it difficult for the adhesive 11 to further enter the inside of the case 10. Therefore, an interface between the adhesive 11 and a sealant 22 can be eliminated or further reduced. Other configurations and effects are similar to those in the embodiment 1.

Embodiment 7

Figure 16:
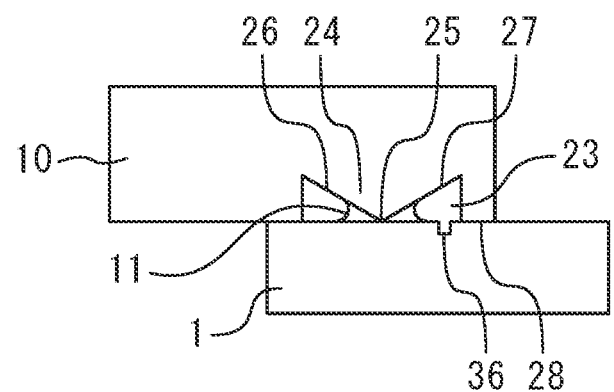
FIG. 16 is a cross-sectional view illustrating a bonding portion between a case and a base plate in a semiconductor module according to an embodiment 7 in an enlarged manner.

FIG. 16 is a cross-sectional view illustrating a bonding portion between a case and a base plate in a semiconductor module according to an embodiment 7 in an enlarged manner. A recess 36 is provided in upper surface peripheral portion of a base plate 1 in a region opposing a lower surface of a case 10. The recess 36 is provided in a region closer to the inner side of the case 10 than a region to which an adhesive 11 is applied. Although the depth of the recess 36 is one-tenth or more of the thickness of the base plate 1, for example, the depth is set to four-fifths or less of the thickness of the base plate 1 to prevent penetration of the base plate 1.

The adhesive 11 crushed by the base plate 1 and the case 10 is housed in the recess 36. This makes it difficult for the adhesive 11 to further enter the inside of the case 10. Therefore, an interface between the adhesive 11 and a sealant 22 can be eliminated or further reduced. Other configurations and effects are similar to those in the embodiment 1.

Figure 17:
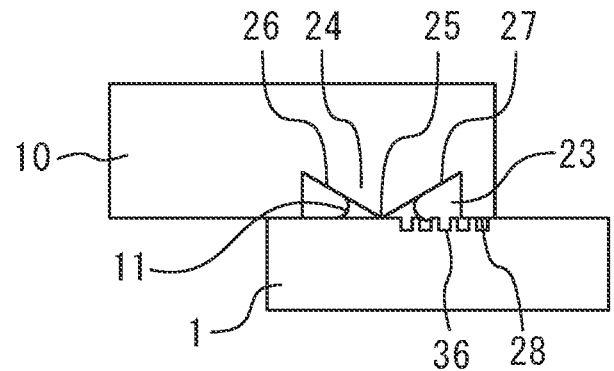
FIG. 17 is a cross-sectional view illustrating a modification 1 to the embodiment 7.

FIG. 17 is a cross-sectional view illustrating a modification 1 to the embodiment 7. A plurality of continuous recesses 36, as in the modification 1, may be provided. As a result, even when an adhesive 11 expands beyond the closest first recess 36, the adhesive 11 is housed in the second or subsequent recess 36. This makes it difficult for the adhesive 11 to further enter the inside of the case 10.

Figure 18:
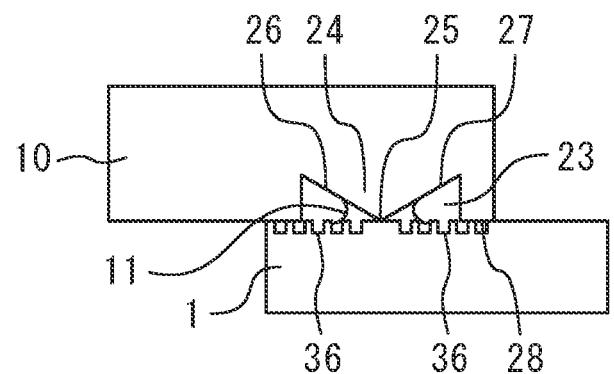
FIG. 18 is a cross-sectional view illustrating a modification 2 to the embodiment 7.

FIG. 18 is a cross-sectional view illustrating a modification 2 to the embodiment 7. A plurality of recesses 36 may be provided in respective regions closer to the inner side and closer to the outer side of a case 10 than a region to which an adhesive 11 is applied, as in the modification 2. This makes it possible to prevent the adhesive 11 from overflowing to the outside of the case 10.

Embodiment 8

Figure 19:
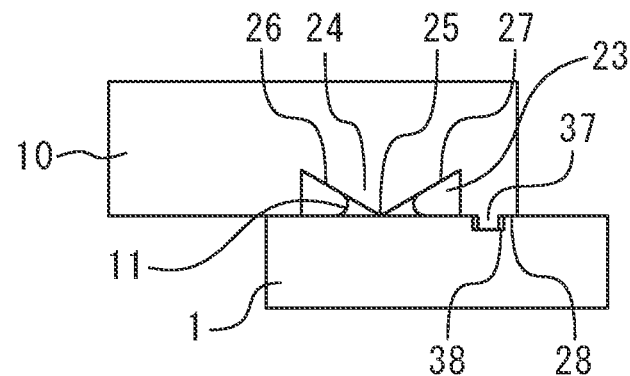
FIG. 19 is a cross-sectional view illustrating a bonding portion between a case and a base plate in a semiconductor module according to an embodiment 8 in an enlarged manner.

FIG. 19 is a cross-sectional view illustrating a bonding portion between a case and a base plate in a semiconductor module according to an embodiment 8 in an enlarged manner. An upper surface peripheral portion of a base plate 1 and a lower surface of a case 10 contact each other in a region closer to the inner side of the case 10 than a groove 23. In such a contact region, a recess 38 is provided in the upper surface peripheral portion of the base plate 1, and a convex part 37 is provided on the lower surface of the case 10. The recess 38 has a size that houses the convex part 37. When the case 10 is bonded to the base plate 1 with an adhesive 11, the convex part 37 and the recess 38 are fitted to each other. The depth of the recess 38 and the height of the convex part 37 are one-tenth or more of the thickness of the base plate 1, for example. To prevent penetration of the base plate 1, the depth of the recess 38 is set to four-fifths or less of the thickness of the base plate 1.

There is a problem that when the adhesive 11 is closer to the inner side of the case 10 than a predetermined position due to a variation in assembly or an amount of application of the adhesive 11 is large, the adhesive 11 expands to reach a contact region between a surface of the base plate 1 and the case 10 and the adhesive 11 enters the inside of the case 10 due to a capillary phenomenon. On the other hand, in the present embodiment, when the convex part 37 and the recess 38 are provided, a flow length of the adhesive 11 is lengthened, thereby making it possible to prevent the adhesive 11 from entering the inside of the case 10. Therefore, a tolerance can be further increased for a variation in application of the adhesive 11.

Figure 20:
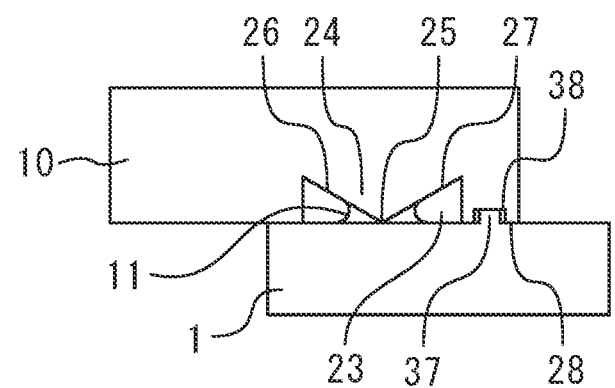
FIG. 20 is a cross-sectional view illustrating a modification 1 to the embodiment 8.

FIG. 20 is a cross-sectional view illustrating a modification 1 to the embodiment 8. In the modification 1, a convex part 37 is provided in an upper surface peripheral portion of a base plate 1, and a recess 38 is provided on a lower surface of a case 10, contrary to FIG. 19. In this case, a similar effect to that in the embodiment 8 can also be obtained.

Figure 21:
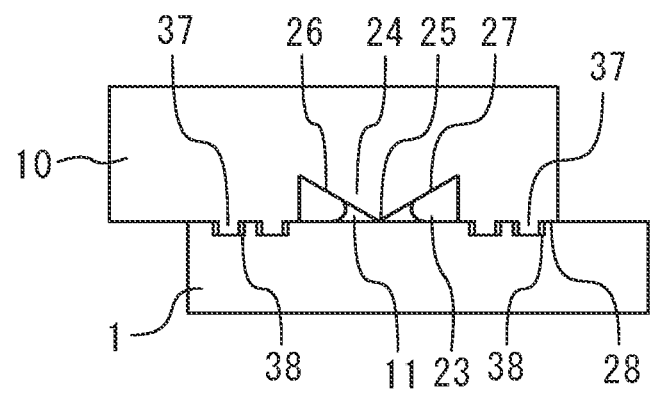
FIG. 21 is a cross-sectional view illustrating a modification 2 to the embodiment 8.

FIG. 21 is a cross-sectional view illustrating a modification 2 to the embodiment 8. In the modification 2, a plurality of protrusions 37 and a plurality of recesses 38 are provided. This makes it difficult for an adhesive 11 to further enter the inside of a case 10. The protrusions 37 and the recesses 38 are also provided in a contact region where an upper surface peripheral portion of a base plate 1 and a lower surface of the case 10 contact each other closer to the outer side of the case 10 than a groove 23. This makes it possible to prevent the adhesive 11 from overflowing to the outside of the case 10.

Figure 22:
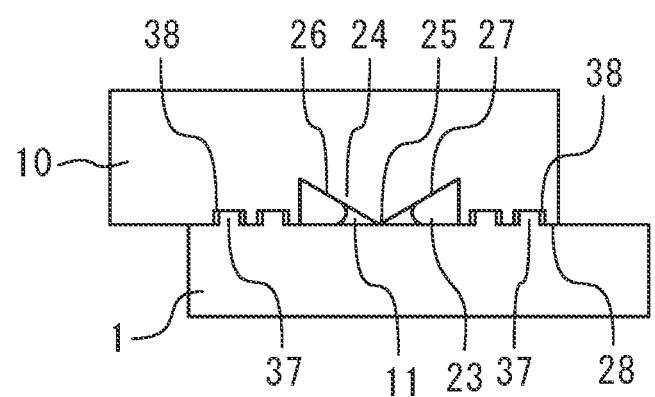
FIG. 22 is a cross-sectional view illustrating a modification 3 to the embodiment 8.

FIG. 22 is a cross-sectional view illustrating a modification 3 to the embodiment 8. In the modification 3, a plurality of protrusions 37 are provided in an upper surface peripheral portion of a base plate 1, and a plurality of recesses 38 are provided on a lower surface of a case 10, contrary to the modification 2. In this case, a similar effect to that in the modification 2 can also be obtained.

Embodiment 9

Figure 23:
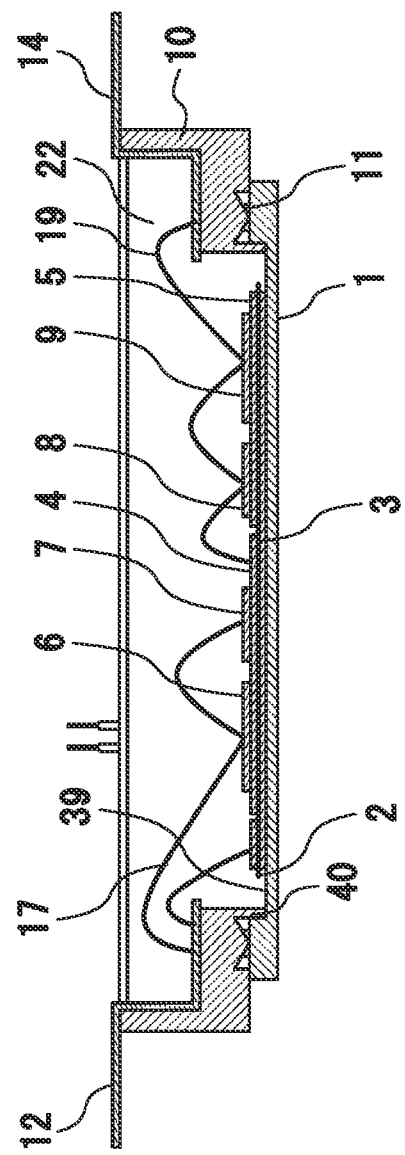
FIG. 23 is a cross-sectional view illustrating a semiconductor module according to an embodiment 9.
Figure 24:
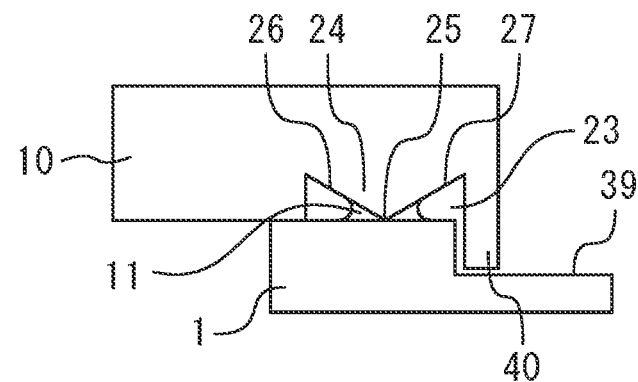
FIG. 24 is a cross-sectional view illustrating a bonding portion between a case and a base plate in the semiconductor module according to the embodiment 9 in an enlarged manner.

FIG. 23 is a cross-sectional view illustrating a semiconductor module according to an embodiment 9. FIG. 24 is a cross-sectional view illustrating a bonding portion between a case and a base plate in the semiconductor module according to the embodiment 9 in an enlarged manner. A recess 39 is provided closer to the inside of a case 10 than an upper surface peripheral portion to which the case 10 is bonded on an upper surface of a base plate 1. An insulating substrate 2 and semiconductor devices 6 to 9 are provided in the recess 39. As a result, a package size can be reduced, a thermal resistance is improved, and warping of a rear surface of the module can be adjusted.

A protrusion 40 is provided closer to the inner side of the case 10 than a groove 23 on a lower surface of the case 10. The protrusion 40 protrudes downward with respect to a portion closer to the outer side of the case 10 than the groove 23 on the lower surface of the case 10, and is inserted into the recess 39. Although an adhesive 11 that has been crushed to expand by bonding between the base plate 1 and the case 10 flows into the case 10, the adhesive 11 is blocked by the protrusion 40. This makes it difficult for the adhesive 11 to enter the inside of the case 10. Therefore, an interface between the adhesive 11 and a sealant 22 can be eliminated or reduced.

Embodiment 10

Figure 25:
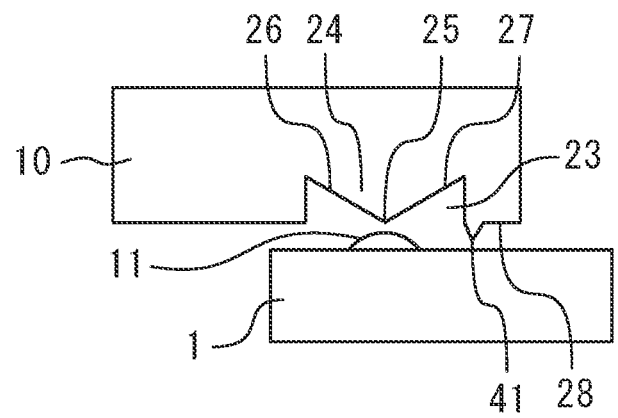
FIG. 25 is a cross-sectional view illustrating a bonding portion between a case and a base plate in a semiconductor module according to an embodiment 10 in an enlarged manner.
Figure 26:
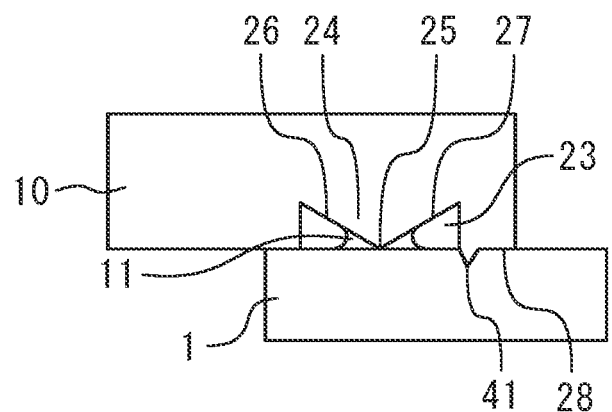
FIG. 26 is a cross-sectional view illustrating a bonding portion between a case and a base plate in a semiconductor module according to an embodiment 10 in an enlarged manner.

FIG. 25 and FIG. 26 are cross-sectional views each illustrating a bonding portion between a case and a base plate in a semiconductor module according to an embodiment 10 in an enlarged manner. FIG. 25 illustrates a state where a case 10 has not yet been bonded to a base plate 1, and FIG. 26 illustrates a state after bonding. A protrusion 41 is provided on a lower surface of the case 10. The protrusion 41 is provided closer to the inner side of the case 10 than a groove 23. The height of the protrusion 41 is one-tenth or more of the thickness of the base plate 1 and is one-half or less of the thickness of the base plate 1, for example. Examples of a material for the base plate 1 to be used include an aluminum material having a lower strength than that of the protrusion 41.

When the case 10 adheres to the base plate 1, an upper surface peripheral portion of the base plate 1 contacts the protrusion 41 and buckles under a surface pressure so that the upper surface peripheral portion of the base plate 1 and the lower surface of the case 10 are bonded to each other. This enables bonding having no or little spacing, thereby making it difficult for an adhesive 11 to further enter the inside of the case 10. Therefore, an interface between the adhesive 11 and a sealant 22 can be eliminated or reduced.

Figure 27:
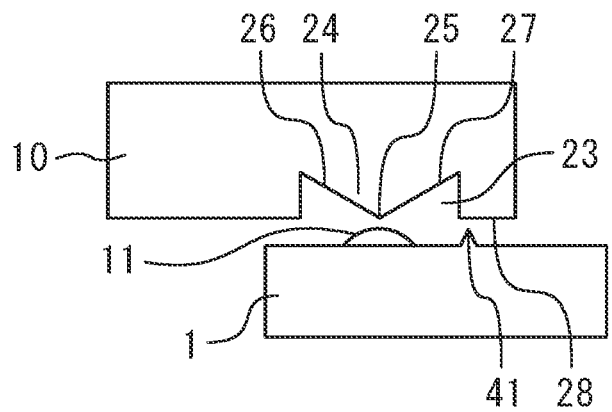
FIG. 27 is a cross-sectional view illustrating a modification 1 to the embodiment 10.
Figure 28:
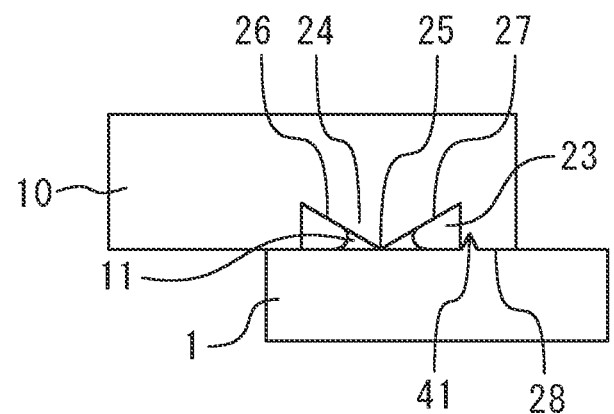
FIG. 28 is a cross-sectional view illustrating a modification 1 to the embodiment 10.

FIG. 27 and FIG. 28 are cross-sectional views illustrating a modification 1 to the embodiment 10. FIG. 27 illustrates a state where a case 10 has not yet been bonded to a base plate 1, and FIG. 28 illustrates a state after bonding. A material having a high strength, for example, copper is used for the base plate 1, and the base plate 1 is provided with a protrusion 41. In this case, a lower surface of the case 10 contacts the protrusion 41 and buckles under a surface pressure so that the base plate 1 and the case 10 are bonded to each other. In this case, a similar effect to that in the embodiment 10 can also be obtained.

Figure 29:
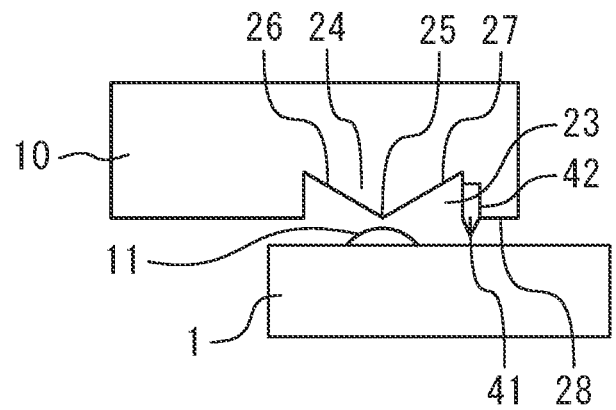
FIG. 29 is a cross-sectional view illustrating a modification 2 to the embodiment 10.

FIG. 29 is a cross-sectional view illustrating a modification 2 to the embodiment 10. A protrusion 41 is a metal 42 inserted into a lower surface of a case 10. The metal 42 has a higher strength than that of a base plate 1. As a result, the base plate 1 easily buckles so that the base plate 1 and the case 10 are easily bonded to each other. The protrusion 41 may be provided by inserting the metal 42 into an upper surface peripheral portion of the base plate 1.

The semiconductor devices 6 to 9 are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module.

REFERENCE SIGNS LIST 1 base plate; 2 insulating substrate; 6-9 semiconductor device; 10 case; 11 adhesive; 22 sealant; 23 groove; 24 protrusion; 25 vertex, 26,27 gradient; 32 surface roughening processing; 33 lattice-shaped sheet; 34 bonding wire; 35, 36, 38, 39 recess; 37,40 protrusion; 41 protrusion; 42 metal

The invention claimed is:

1. A semiconductor module comprising:
a base plate;
an insulating substrate provided on the base plate;
a semiconductor device provided on the insulating substrate;
a case arranged to surround the insulating substrate and the semiconductor device and bonded to the base plate with an adhesive; and
a sealant sealing the insulating substrate and the semiconductor device in the case,
wherein a groove is provided on a lower surface of the case opposing an upper surface peripheral portion of the base plate,
a bottom surface of the groove has a protruding part protruding toward the base plate,
the protruding part includes a vertex and gradients respectively provided closer to an inner side of the case and closer to an outer side of the case with the vertex sandwiched therebetween, the adhesive contacts the vertex and is housed in the groove, and
an inner surface of the groove in the case and a region, to which the adhesive is applied, of the base plate are subjected to surface roughening processing.

2. The semiconductor module according to claim 1, wherein a height of the protruding part is not more than a height at which the vertex contacts the base plate.

3. The semiconductor module according to claim 1, wherein the protruding part has a curved shape.

4. The semiconductor module according to claim 1, wherein a lattice-shaped sheet is affixed to the region, to which the adhesive is applied, of the base plate.

5. The semiconductor module according to claim 1, wherein a bonding wire is provided on the upper surface peripheral portion of the base plate opposing the groove.

6. The semiconductor module according to claim 5, wherein the bonding wire is provided in a region closer to the inner side of the case than the region to which the adhesive is applied.

7. The semiconductor module according to claim 1, wherein a recess is provided in the base plate, and
the adhesive is applied in the recess.

8. The semiconductor module according to claim 1, wherein a recess is provided in the upper surface peripheral portion of the base plate opposing the lower surface of the case.

9. The semiconductor module according to claim 8, wherein the recess includes a plurality of recesses.

10. The semiconductor module according to claim 1, wherein the semiconductor device is made of a wide-bandgap semiconductor.

11. A semiconductor module comprising:
a base plate;
an insulating substrate provided on the base plate;
a semiconductor device provided on the insulating substrate;
a case arranged to surround the insulating substrate and the semiconductor device and bonded to the base plate with an adhesive; and
a sealant sealing the insulating substrate and the semiconductor device in the case,
wherein a groove is provided on a lower surface of the case opposing an upper surface peripheral portion of the base plate,
a bottom surface of the groove has a protruding part protruding toward the base plate,
the protruding part includes a vertex and gradients respectively provided closer to an inner side of the case and closer to an outer side of the case with the vertex sandwiched therebetween,
the adhesive contacts the vertex and is housed in the groove,
a recess is provided in the upper surface peripheral portion of the base plate opposing the lower surface of the case, and
the recess is provided in a region closer to the inner side of the case than a region to which the adhesive is applied.

12. A semiconductor module comprising:
a base plate;
an insulating substrate provided on the base plate;
a semiconductor device provided on the insulating substrate;
a case arranged to surround the insulating substrate and the semiconductor device and bonded to the base plate with an adhesive; and
a sealant sealing the insulating substrate and the semiconductor device in the case,
wherein a groove is provided on a lower surface of the case opposing an upper surface peripheral portion of the base plate,
a bottom surface of the groove has a protruding part protruding toward the base plate,
the protruding part includes a vertex and gradients respectively provided closer to an inner side of the case and closer to an outer side of the case with the vertex sandwiched therebetween,
the adhesive contacts the vertex and is housed in the groove, and
a convex part is provided on one of an upper surface peripheral portion of the base plate and the lower surface of the case, a recess is provided on the other of the upper surface peripheral portion of the base plate and the lower surface of the case, and the convex part and the recess are fitted to each other.

13. The semiconductor module according to claim 12, wherein the convex part and the recess are provided closer to the inner side of the case than the groove.

14. The semiconductor module according to claim 12, wherein the convex part includes a plurality of convex parts, and the recess includes a plurality of recesses.

15. A semiconductor module comprising:
a base plate;
an insulating substrate provided on the base plate;
a semiconductor device provided on the insulating substrate;
a case arranged to surround the insulating substrate and the semiconductor device and bonded to the base plate with an adhesive; and
a sealant sealing the insulating substrate and the semiconductor device in the case,
wherein a groove is provided on a lower surface of the case opposing an upper surface peripheral portion of the base plate,
a bottom surface of the groove has a protruding part protruding toward the base plate,
the protruding part includes a vertex and gradients respectively provided closer to an inner side of the case and closer to an outer side of the case with the vertex sandwiched therebetween,
the adhesive contacts the vertex and is housed in the groove,
a recess is provided closer to the inner side of the case than the upper surface peripheral portion to which the case is bonded on an upper surface of the base plate,
the insulating substrate and the semiconductor device are provided in the recess,
a convex part is provided closer to the inner side of the case than the groove on the lower surface of the case, and
the convex part is inserted into the recess.

16. The semiconductor module according to claim 1, wherein a protrusion is provided on one of the upper surface peripheral portion of the base plate and the lower surface of the case, and
the other contacts the protrusion and buckles under a surface pressure so that the base plate and the case are bonded to each other.

17. The semiconductor module according to claim 16, wherein the protrusion is provided closer to the inner side of the case than the groove.

18. The semiconductor module according to claim 16, wherein the protrusion is a metal inserted into one of the upper surface peripheral portion of the base plate and the lower surface of the case, and has a higher strength than the other.

\* \* \* \* \*